United States Patent
Ignjatovic

(10) Patent No.: US 7,649,481 B2
(45) Date of Patent: Jan. 19, 2010

(54) BLUE-NOISE-MODULATED SIGMA-DELTA ANALOG-TO-DIGITAL CONVERTER

(75) Inventor: Zeljko Ignjatovic, Rochester, NY (US)

(73) Assignee: University of Rochester, Rochester, NY (US)

( * ) Notice: Subject to any disclaimer, the term of this patent is extended or adjusted under 35 U.S.C. 154(b) by 0 days.

(21) Appl. No.: 12/067,614

(22) PCT Filed: Sep. 22, 2006

(86) PCT No.: PCT/US2006/036997

§ 371 (c)(1),
(2), (4) Date: Jul. 30, 2008

(87) PCT Pub. No.: WO2007/038280

PCT Pub. Date: Apr. 5, 2007

(65) Prior Publication Data
US 2008/0297389 A1    Dec. 4, 2008

Related U.S. Application Data

(60) Provisional application No. 60/719,550, filed on Sep. 23, 2005.

(51) Int. Cl.
*H03M 1/20*     (2006.01)
*H03M 3/00*     (2006.01)

(52) U.S. Cl. ...................................... 341/131; 341/143
(58) Field of Classification Search .................. 341/131, 341/143
See application file for complete search history.

(56) References Cited

U.S. PATENT DOCUMENTS

| 4,761,634 | A | * | 8/1988 | Yamaguchi et al. ......... 341/131 |
| 4,994,805 | A | * | 2/1991 | Dedic et al. ................. 341/143 |
| 5,033,018 | A | * | 7/1991 | Adcock ....................... 708/303 |
| 5,671,247 | A | * | 9/1997 | Souissi et al. ................ 375/144 |
| 6,201,835 | B1 | * | 3/2001 | Wang ........................... 341/143 |
| 6,707,409 | B1 | | 3/2004 | Ignjatovic et al. |
| 2002/0041243 | A1 | | 4/2002 | Fukuhara et al. |
| 2004/0057597 | A1 | * | 3/2004 | Rhoads ....................... 382/100 |

FOREIGN PATENT DOCUMENTS

JP     2004 120239 A     4/2004
WO     WO 98/54840 A2     12/1998

OTHER PUBLICATIONS

Moule, A., A Time-Interleaved ADC Multiplexed by a Blue-Noise Randomization Method, IEEE Proceedings of 48th Midwest Symposium on Circuits and Systems, Aug. 2005, vol. 1, pp. 863-866.

* cited by examiner

*Primary Examiner*—Howard Williams
(74) *Attorney, Agent, or Firm*—Blank Rome LLP

(57) ABSTRACT

A sigma-delta ADC (200A) uses blue-noise (random, pseudo-random) modulation (202) to reduce the effect of the substrate noise. Pairs of blue-noise multipliers (202) are placed before and after each non-delayed integrator (106). In the case of a sample-delayed integrator, the integrator is first separated into a non-delayed integrator (110) followed by the delay element (112). The multiplying sequence is a sequence of 1's and −1's that has blue-noise spectral characteristics (i.e., the spectrum has a low frequency deficiency).

15 Claims, 5 Drawing Sheets

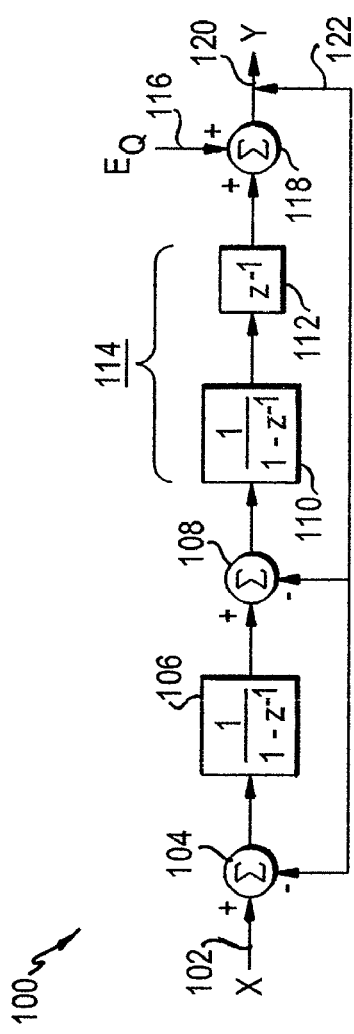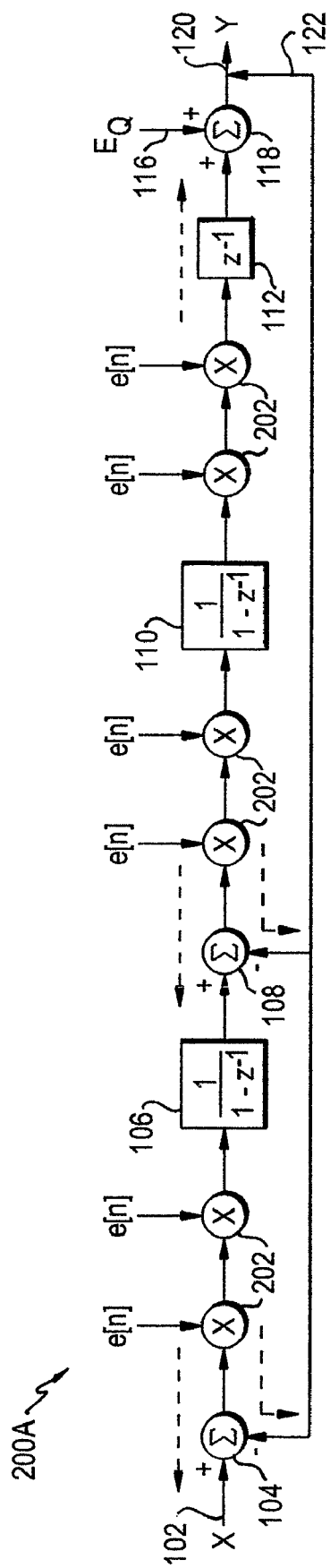

BLUE-NOISE-MODULATED SIGMA-DELTA ANALOG-TO-DIGITAL CONVERTER

REFERENCE TO RELATED APPLICATION

The present application claims the benefit of U.S. Provisional Patent Application No. 60/719,550, filed Sep. 23, 2005, whose disclosure is hereby incorporated by reference in its entirety into the present disclosure.

FIELD OF THE INVENTION

The present invention is directed to a sigma-delta analog-to-digital converter and more particularly to such a converter in which the multiplying sequence has blue-noise spectral characteristics.

DESCRIPTION OF RELATED ART

As CMOS technology scaling continues to reduce feature size, chip designers will integrate more and more analog and digital circuitry together on the same die in an effort to reduce cost. However, integration of systems-on-a-chip (SoC) requiring the placement of noise-sensitive analog blocks and noisy digital signal processing blocks together on a common substrate will most likely continue to increase the amount of substrate noise generated by the digital circuitry. In particular, mixed-signal designs such as $\Sigma\Delta$ (sigma-delta) ADC's, where the analog and digital components cannot necessarily be placed far from each other, will see significant performance degradations caused by substrate noise. The SNDR of a $\Sigma\Delta$ modulator may decrease by over 20 dB in the presence of noisy digital circuitry such as toggling inverters.

It is well known that $\Sigma\Delta$ ADC's are suitable for high resolution and low-to-moderate bandwidth applications. However, when substrate noise is introduced into the $\Sigma\Delta$ modulator, dynamic range is sacrificed.

FIG. 1 shows a conventional second-order $\Sigma\Delta$ modulator 100. In the modulator 100, a signal received through an input 102 is applied to a subtracting circuit 104, where a feedback signal (to be described later) is subtracted from the signal. The resulting signal is integrated in a non-delayed integrator 106. The integrated signal is applied to a subtracting circuit 108, where the feedback signal is subtracted from the integrated signal. The resulting signal is integrated in a non-delayed integrator 110 and a delay circuit 112, which together form a sample-delayed integrator 114. The additive noise contribution from the modulator's quantizer is modeled as a signal EQ received through an input 116 and added to the integrated signal in an adding circuit 118. The output signal is applied to an output 120 as well as to a feedback loop 122, where it is applied as the above-mentioned feedback signal to the subtracting circuits 104 and 108. The conventional modulator 100 does not adequately address the noise problem.

Similar work is disclosed in U.S. Pat. Nos. 6,707,409 and 7,038,532, whose disclosures are hereby incorporated by reference in their entireties into the present disclosure. However, those patents do not directly address the noise problem in the same manner as the present invention.

SUMMARY OF THE INVENTION

It is therefore an object of the invention to provide a $\Sigma\Delta$ ADC which overcomes the above difficulties of the prior art.

To achieve the above and other objects, the present invention is directed to a $\Sigma\Delta$ ADC using blue-noise modulation (or, more generally, modulation with a random or pseudo-random noise sequence) to reduce the effect of the substrate noise. The blue-noise modulated $\Sigma\Delta$ ADC is obtained by placing pairs of blue-noise multipliers before and after each non-delayed integrator in a $\Sigma\Delta$ ADC such as the conventional $\Sigma\Delta$ ADC shown in FIG. 1. In the case of a sample-delayed integrator, the integrator is first separated into a non-delayed integrator followed by the delay element. The multiplying sequence, e[n], used to modulate the signals throughout the blue-noise $\Sigma\Delta$ modulator is a sequence of 1's and −1's that has blue-noise spectral characteristics (i.e., the spectrum has a low frequency deficiency).

The $\Sigma\Delta$ modulator architecture presented herein utilizes blue-noise modulation, whereby a signal with blue-noise spectral characteristics, used as a chopper signal, eliminates the substrate noise spectral peaks by spreading them across the entire ADC spectrum. The noise is then shaped away from the baseband input signal to high frequency as is typical for oversampling $\Sigma\Delta$ ADC's. The present invention eliminates the strong distortion component near DC created by harmonics of the digital sampling clock.

The present invention can be implemented as an easy modification of mature conventional technology. Simulations of such architecture have proved the ability to suppress substrate noise generated by noisy digital blocks placed on the same die as sensitive analog circuits. The result is in an overall improvement in SNR of over 14 dB.

In addition to reducing the effects of substrate noise, the present invention also eliminates the effects of integrator op-amp non-idealities, such as 1/f noise and DC offset, and DAC DC offset and even-order non-linearities. An example utilizing a second-order blue-noise modulated $\Sigma\Delta$ ADC with a 1-bit quantizer is presented as an illustrative rather than limiting embodiment. Additionally, a method to generate the required blue-noise sequence is presented. Simulation results demonstrate that this architecture achieves a 14 dB improvement in SNR over the traditional second-order $\Sigma\Delta$ ADC.

BRIEF DESCRIPTION OF THE DRAWINGS

A preferred embodiment of the present invention will be set forth in detail with reference to the drawings, in which:

FIG. 1 is a block diagram showing a conventional second-order $\Sigma\Delta$ modulator;

FIGS. 2A-2C are block diagrams showing steps in the design of a blue-noise-modulated $\Sigma\Delta$ modulator according to the preferred embodiment;

DETAILED DESCRIPTION OF THE PREFERRED EMBODIMENT

Figure 2B:
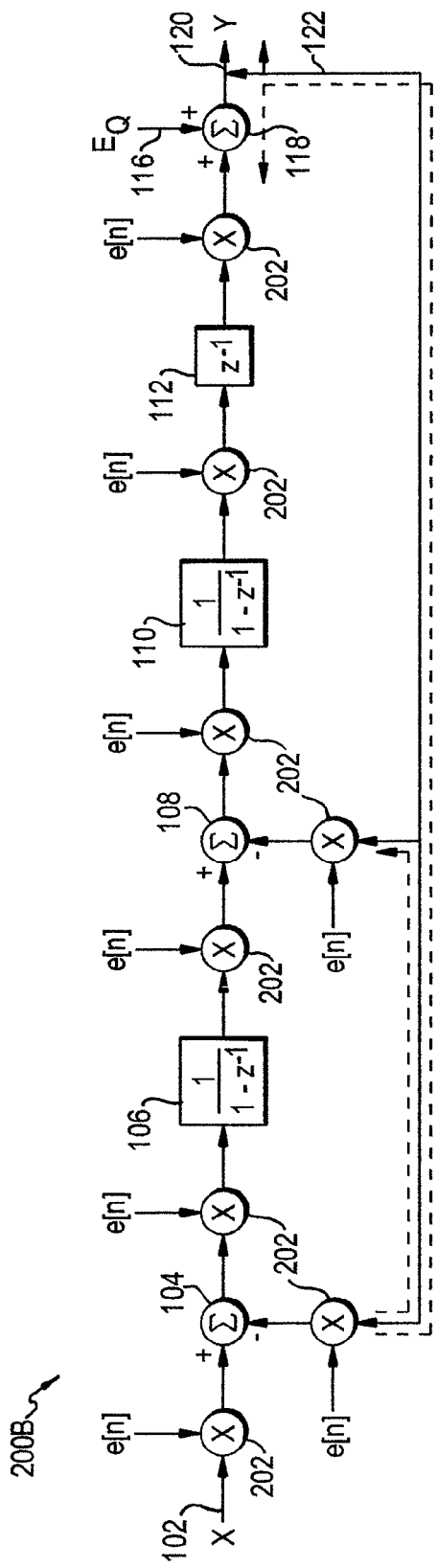

A preferred embodiment of the present invention will be set forth in detail with reference to the drawings, in which like reference numerals refer to like elements throughout.

Figure 2C:
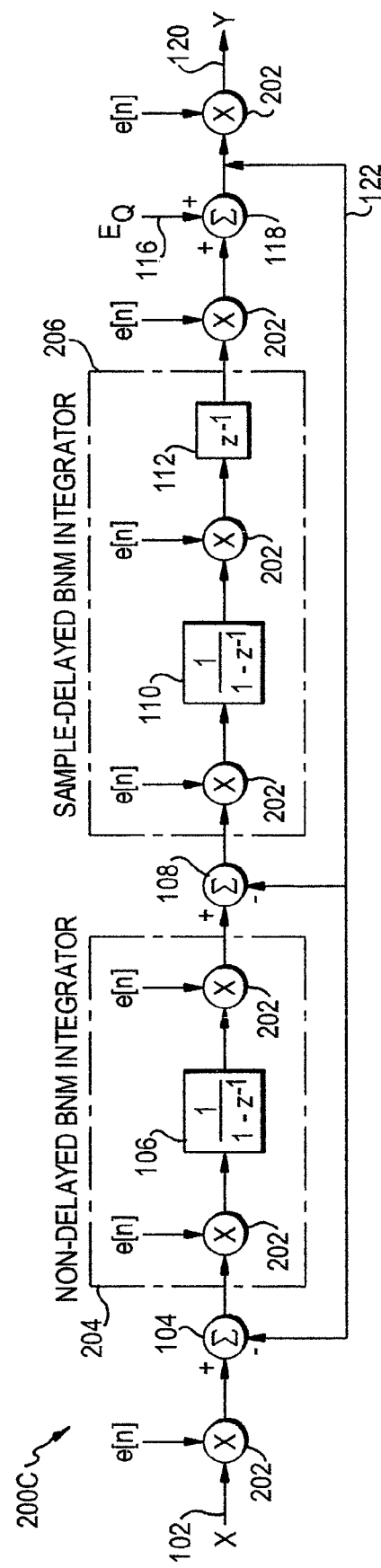

FIGS. 2A-2C show steps in the design of the $\Sigma\Delta$ ADC of the preferred embodiment, using as a starting point the conventional ADC of FIG. 1.

As shown in FIG. 2A, the blue-noise sequences 202 are introduced into the modulator structure in pairs to form a structure 200A. Thus, they effectively perform multiplication by 1, leaving the overall modulator function unchanged. Once the blue-noise multipliers 202 are inserted, as shown in FIG. 2A, one multiplier 202 from each pair is moved through the modulator to produce the blue-noise modulated ΣΔ modulator structure 200C shown in FIG. 2C. FIG. 2B shows the intermediate stage 200B in rearranging the blue-noise multipliers to create the blue-noise modulated ΣΔ ADC. The dashed arrows in FIGS. 2A and 2B depict the direction in which a particular blue-noise multiplier is moved. This structural transformation can be applied to any traditional ΣΔ modulator to create a blue-noise modulated ΣΔ modulator. The architecture 200C presented in FIG. 2C incorporates a non-delayed blue-noise modulated (BNM) integrator structure 204 and a sample-delayed BNM integrator structure 206. As noted above, EQ models the additive noise contribution from the modulator's quantizer. A distinct advantage of the blue-noise modulated ΣΔ modulator 200C is that it can be easily implemented, based on mature ΣΔ modulator technology.

The input signal can be modulated with the same blue-noise (random, pseudo-random) sequence prior to being connected to the subtracting circuit, as shown in FIG. 2C. The sequence used to modulate the input signal can be a delayed or advanced version of the sequence used with in the ΣΔ modulator.

Figure 3A:
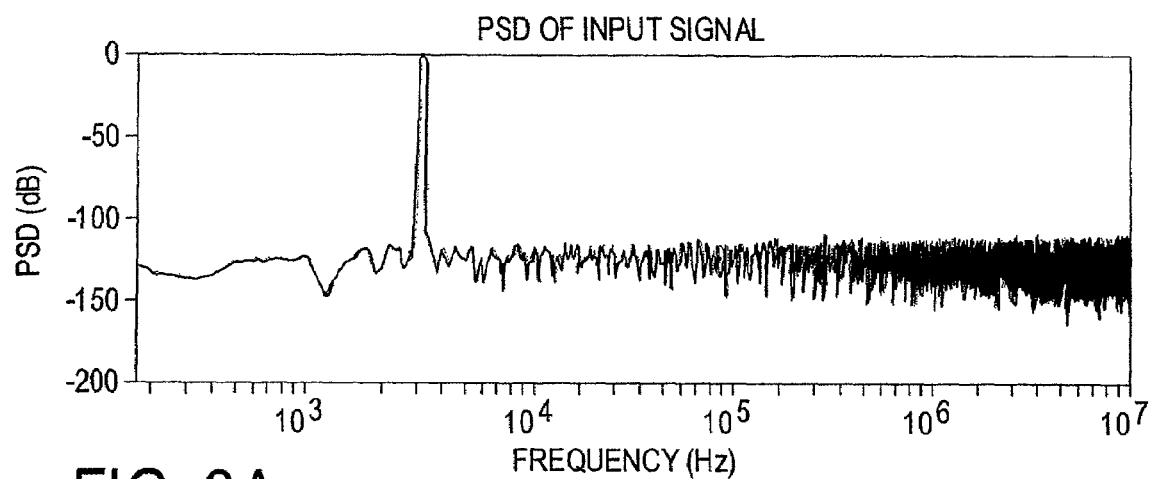
FIGS. 3A and 3B are plots of input signal spectra before and after blue-noise modulation, respectively.
Figure 3B:
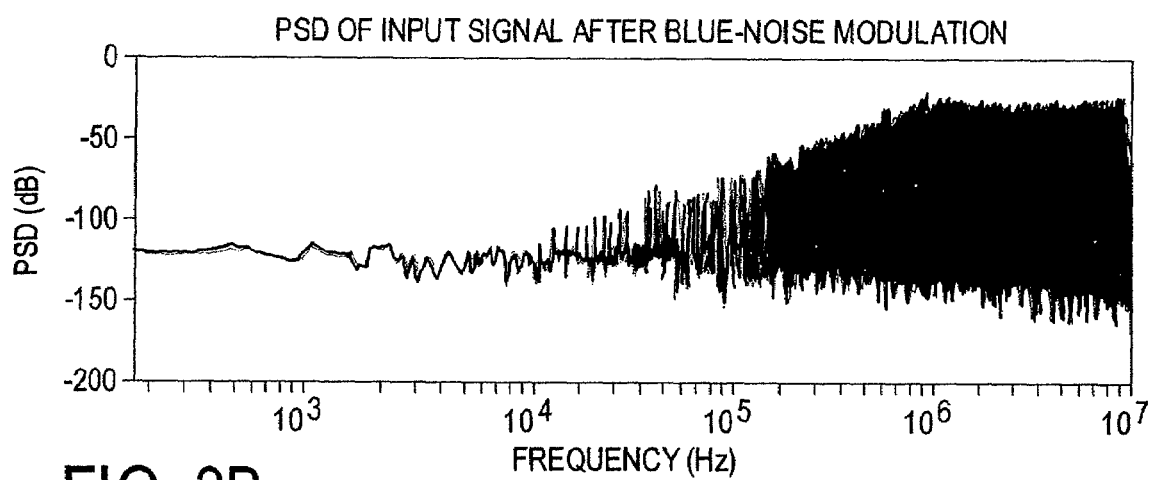

In addition to spreading substrate noise, which exhibits strong spectral peaks, blue-noise modulation also negates the effects of integrator op-amp and DAC non-idealities (1/f noise, DC offset, and even-order nonlinearities). This is due to the fact that blue-noise modulation shapes the input signal about the Nyquist frequency before it sees the non-idealities from the integrator op-amps and DAC. The input signal spectra before and after blue-noise modulation are shown in FIGS. 3A and 3B, respectively. The undesirable effects will remain at low frequency where the quantization noise is shaped by the blue-noise modulated integrator structures. When the output blue-noise modulation is performed, the input signal is returned to baseband, while the shaped quantization noise along with the low-frequency 1/f noise and DC offsets are pushed toward high frequency.

Figure 4:
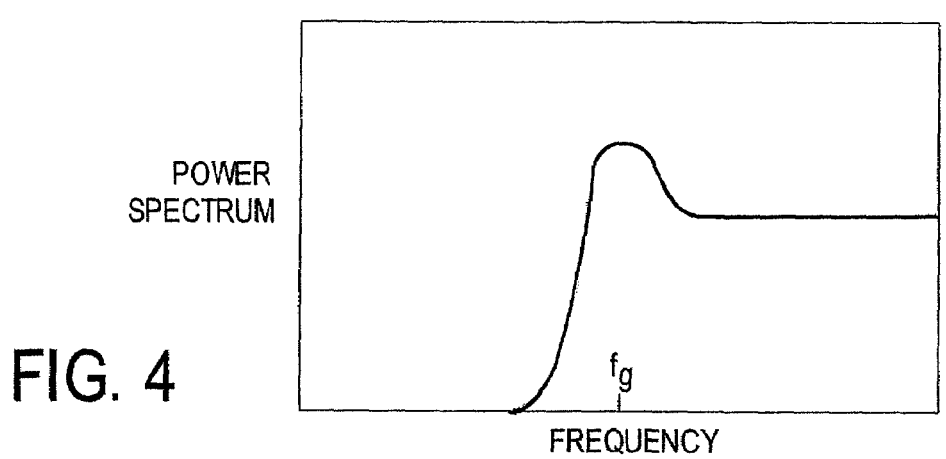
FIG. 4 is a plot showing a representative blue-noise spectrum.

The spectrum of a blue-noise sequence consists of low frequency deficiencies and uncorrelated high-frequency fluctuations that are classified as high-frequency white noise. The sharp transition between the energy-limited low frequency portion of the blue-noise spectrum and the high-frequency white noise occurs at the principal frequency. The principal frequency for a particular blue-noise sequence is commonly denoted $f_g$. The spectrum of a typical blue-noise sequence is shown in FIG. 4.

Figure 5:
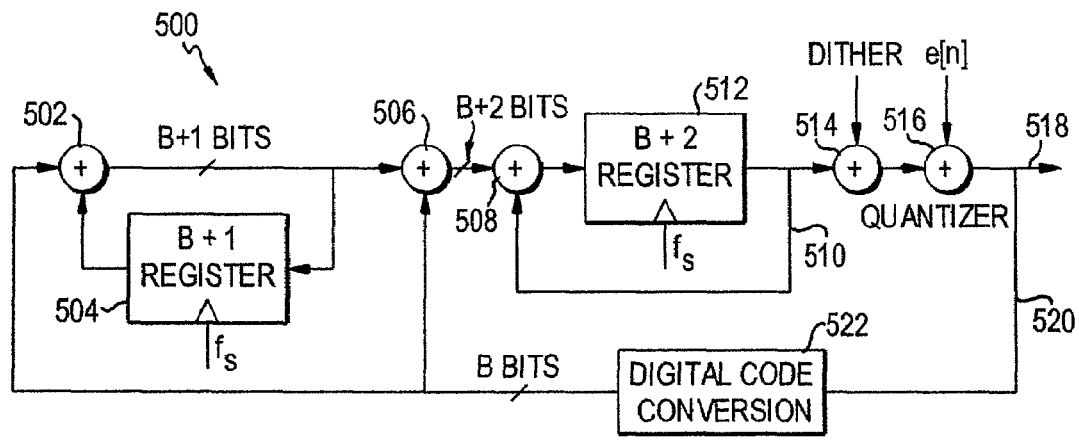
FIG. 5 is a block diagram showing an all-digital $\Sigma\Delta$ modulator for generating the blue-noise sequence.

The binary blue-noise sequence necessary for blue-noise modulation can be generated using an all-digital ΣΔ modulator. Replacing the integrators from traditional ΣΔ modulators with accumulators creates an all-digital ΣΔ architecture which is shown in FIG. 5 as 500. In the architecture 500, an adder 502 adds a feedback signal, to be explained below, to the contents of a B+1 register 504, which samples the output of the adder 502 at a sampling frequency $f_s$. The result of the adder 502 is also supplied to a subtracting circuit 506, where the feedback signal is subtracted. The result is supplied to another adder 508, where a second feedback signal from a feedback loop 510 is added.

The addition result is supplied to a B+2 register 512, which samples it at the same sampling frequency $f_s$. The output of the B+2 register 512 is supplied to both the feedback loop 510 and an adder 514 to which a dither is added. The result is supplied to a quantizer 516, where e[n] is derived, to supply an output signal of B bits. The output signal is supplied to both an output 518 and a feedback loop 520, where it undergoes digital code conversion in a digital code converter 522 to supply the feedback signal which is supplied to the adder 520 and the subtracting circuit 506. Since the blue-noise sequences used in the blue-noise modulated ΣΔ modulator consist only of 1's and −1's the quantizer needs to resolve B=1 bit. Similar algorithms that produce blue-noise sequences have been proposed for fractional-N PLL applications and for DAC dynamic-element matching in multi-bit ΣΔ ADC applications.

Alternatively, the sequence e[n] can be stored, entirely or in part, in a local memory shown in FIG. 2C as 208.

The behavioral simulation results presented below were obtained from Matlab/Simulink models of a second-order, 1-bit ΣΔ modulator. The input used for the simulations was a sinusoidal signal with frequency $f_{in}$ =4.1 kHz lying within an 11.025 kHz bandwidth. The OSR was selected to be 512, resulting in a sampling frequency of $f_s$=11.2896 MHz. The substrate coupling noise used for the simulations was obtained in the lab from Maxim IC's MAX1403 18-bit ΣΔ ADC. The measured noise, which contained the digital sampling clock and several strong higher harmonics and subharmonics, was imported into Matlab for the simulations and injected into the first integrator in the ΣΔ modulator. Also, in order to provide realistic simulations, non-ideal op-amp models were used for the integrators. The simulations were performed assuming room temperature, a finite op-amp gain, finite gain-bandwidth, slew rate, and saturation. In addition to the op-amp non-idealities, clock jitter was also taken into account.

Figure 6:
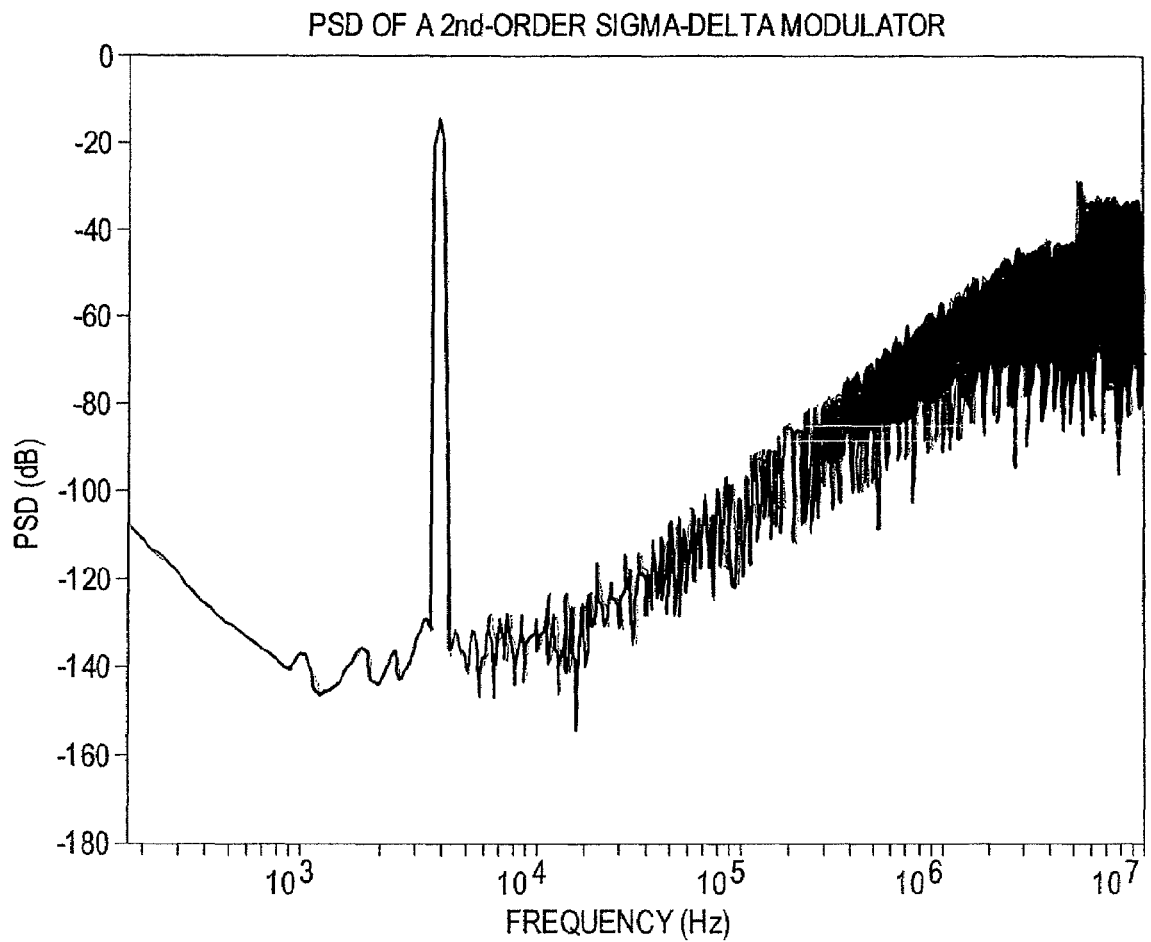
FIG. 6 is a plot showing an output spectrum of a conventional second-order, one-bit $\Sigma\Delta$ modulator.
Figure 7:
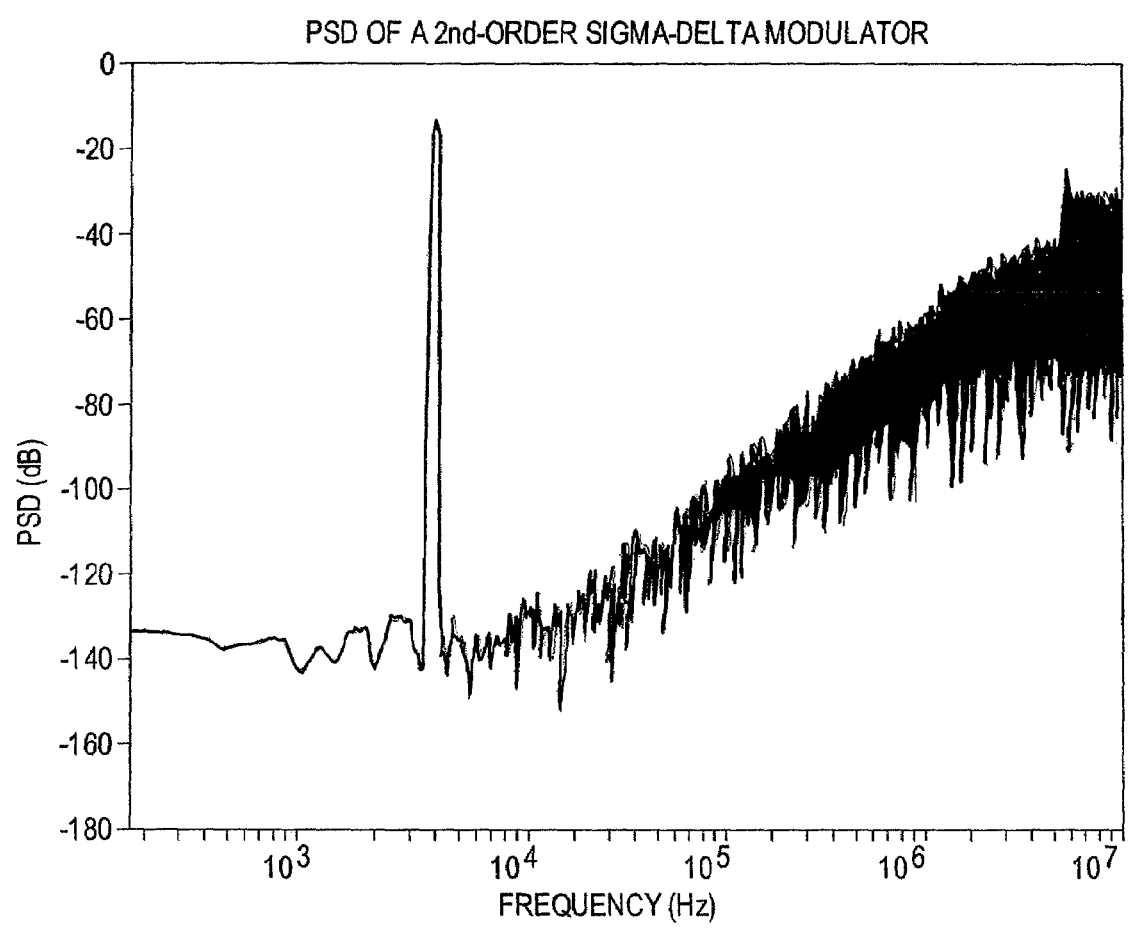
FIG. 7 is a plot showing an output spectrum of a blue-noise-modulated $\Sigma\Delta$ modulator according to the preferred embodiment.

The output spectrum of a typical second-order 1-bit ΣΔ modulator is shown in FIG. 6. The output spectrum clearly depicts the modulator's vulnerability to low-frequency noise, which limits the SNR to 88 dB in simulation. The output spectrum of the blue-noise modulated ΣΔ modulator, shown in FIG. 7, reveals that this architecture suppresses the low-frequency distortions present in the traditional modulator spectrum. The resulting SNR for the blue-noise modulated architecture using the same parameters as the simulation without blue-noise modulation is 102 dB. The proposed architecture demonstrates a 14 dB improvement in SNR from traditional ΣΔ modulator designs, which results in an increase in effective resolution of over 2 bits.

While a preferred embodiment has been described in detail, those skilled in the art who have reviewed the present disclosure will readily appreciate that other embodiments can be realized within the scope of the invention. For example, a ΣΔ ADC of any order can be implemented. Also, any suitable source of a binary blue-noise sequence can be used. Moreover, any feature disclosed in U.S. Pat. Nos. 6,707,409 or 7,038,532 can be incorporated into the present invention as needed. Therefore, the invention should be construed as limited only by the appended claims.

I claim:
1. A sigma-delta modulator comprising:
an input for receiving an input signal;
an output for outputting an output signal;
a subtracting circuit having first and second inputs, the first input being connected to the input of the sigma-delta modulator;
a feedback circuit connected between the output of the modulator and the second input of the subtracting circuit;

an integrator connected between the subtracting circuit and the output of the modulator; and a pair of multipliers, a first one of the multipliers being connected between the subtracting circuit and the integrator and a second one of the multipliers being connected between the integrator and the output of the modulator, for introducing a random or pseudo-random noise sequence into the modulator.

2. The sigma-delta modulator of claim 1, wherein the random or pseudo-random noise sequence comprises a sequence of ones and negative ones.

3. The sigma-delta modulator of claim 1, wherein the random or pseudo-random noise sequence has blue-noise spectral properties.

4. The sigma-delta modulator of claim 1, wherein the input signal is modulated with the random or pseudo-random noise sequence prior to being supplied to the subtracting circuit.

5. The sigma-delta modulator of claim 4, wherein the input signal is modulated with an advanced version of the random or pseudo-random noise sequence.

6. The sigma-delta modulator of claim 4, wherein the input signal is modulated with a delayed version of the random or pseudo-random noise sequence.

7. The sigma-delta modulator of claim 1, wherein the integrator is a non-delayed integrator.

8. The sigma-delta modulator of claim 1, wherein the integrator comprises a non-delayed integrator and a delay element.

9. The sigma-delta modulator of claim 8, wherein the second one of the multipliers is connected between the non-delayed integrator and the delay element.

10. The sigma-delta modulator of claim 1, wherein the sigma-delta modulator is of order higher than one.

11. The sigma-delta modulator of claim 10, further comprising a second subtracting circuit and a second integrator connected between the integrator and the output, and wherein the feedback loop is also connected to an input of the second subtracting circuit.

12. The sigma-delta modulator of claim 11, further comprising a second pair of multipliers, one connected between the second subtracting circuit and the second integrator and another connected between the second integrator and the output of the modulator, for introducing the random or pseudo-random noise sequence into the modulator.

13. The sigma-delta modulator of claim 1, further comprising a second, all-digital sigma-delta modulator for generating the random or pseudo-random noise sequence.

14. The sigma-delta modulator of claim 1, further comprising a memory for storing at least part of the random or pseudo-random noise sequence.

15. The sigma-delta modulator of claim 14, wherein the memory is a local memory.

* * * * *